United States Patent
Sato

(10) Patent No.: US 8,073,646 B2
(45) Date of Patent: Dec. 6, 2011

(54) PLASMA PROCESSING APPARATUS, RADIO FREQUENCY GENERATOR AND CORRECTION METHOD THEREFOR

(75) Inventor: Kenji Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 788 days.

(21) Appl. No.: 12/058,215

(22) Filed: Mar. 28, 2008

(65) Prior Publication Data

US 2008/0237031 A1 Oct. 2, 2008

Related U.S. Application Data

(60) Provisional application No. 60/941,790, filed on Jun. 4, 2007.

(30) Foreign Application Priority Data

Mar. 30, 2007 (JP) .................................. 2007-094048
Mar. 27, 2008 (KR) ........................ 10-2008-0028399

(51) Int. Cl.
*H01L 21/306* (2006.01)

(52) U.S. Cl. .............. 702/106; 156/345.24; 156/345.28; 156/345.47; 118/712; 118/723 R; 118/723 E; 216/59; 216/61; 333/32; 333/17.3; 324/707; 324/464; 315/111.21

(58) Field of Classification Search .................. 702/106; 156/345.32, 345.24, 345.28, 345.47, 345.31, 156/345.38, 345.25, 345.43; 118/712, 719, 118/728, 723 R, 723 E; 216/41, 59, 60, 61; 333/33, 32, 17.3, 133, 99 PL; 324/707, 464, 324/96, 117; 315/111.21

See application file for complete search history.

(56) References Cited

U.S. PATENT DOCUMENTS

| 5,272,417 A * | 12/1993 | Ohmi ........................ 315/111.21 |
| 5,273,610 A * | 12/1993 | Thomas et al. ........... 156/345.28 |
| 5,314,603 A | 5/1994 | Sugiyama et al. |
| 5,543,689 A | 8/1996 | Ohta et al. |
| 5,859,501 A * | 1/1999 | Chi ........................... 315/111.21 |

(Continued)

FOREIGN PATENT DOCUMENTS

JP   H4-72599   6/1992

(Continued)

OTHER PUBLICATIONS

Chinese Office Action issued Aug. 2, 2010, in Patent Application No. 200810086928.0 (with English-language translation).

*Primary Examiner* — Carol S Tsai

(74) *Attorney, Agent, or Firm* — Oblon, Spivak, McClelland, Maier & Neustadt, L.L.P.

(57) ABSTRACT

A plasma processing apparatus includes a radio frequency generator capable of adjusting a target output power level based on the set power level and the offset level to output radio frequency power; a chamber in which a plasma process is performed; and a power detection unit for measuring radio frequency power level fed to the matching unit. The plasma processing apparatus further includes a generator control unit for controlling the radio frequency power such that the radio frequency power level fed to the matching unit reaches the set power level by calculating the offset level based on the difference between the set power level and the power level measured by the power detection unit and transmitting the set power level and the offset level in digital form to the data input terminal of the radio frequency generator.

14 Claims, 7 Drawing Sheets

U.S. PATENT DOCUMENTS

| | | | |
|---|---|---|---|
| 6,043,607 A * | 3/2000 | Roderick | 315/111.21 |
| 6,424,232 B1 * | 7/2002 | Mavretic et al. | 333/17.3 |
| 6,792,889 B2 | 9/2004 | Nakano et al. | |
| 6,929,712 B2 * | 8/2005 | Hanazaki et al. | 156/345.28 |
| 7,101,458 B2 * | 9/2006 | Oh et al. | 156/345.25 |
| 7,150,805 B2 * | 12/2006 | Kikuchi et al. | 156/345.44 |
| 7,737,706 B2 * | 6/2010 | Yamazawa | 324/707 |
| 7,794,615 B2 * | 9/2010 | Ogawa | 216/59 |
| 7,815,767 B2 * | 10/2010 | Sato | 156/345.47 |
| 2001/0025691 A1 * | 10/2001 | Kanno et al. | 156/345 |
| 2004/0182515 A1 * | 9/2004 | Sato | 156/345.43 |
| 2006/0220574 A1 * | 10/2006 | Ogawa | 315/111.21 |
| 2007/0186857 A1 * | 8/2007 | Kim et al. | 118/723 R |
| 2009/0014414 A1 * | 1/2009 | Tomioka et al. | 216/41 |

FOREIGN PATENT DOCUMENTS

| | | | |
|---|---|---|---|
| JP | 5-205898 | | 8/1993 |
| JP | 05205898 A | * | 8/1993 |
| JP | H7-191764 | | 7/1995 |
| JP | H8-162291 | | 6/1996 |
| JP | 11-149996 | | 6/1999 |
| JP | 2001-197749 | | 7/2001 |
| JP | 2003-224112 | | 8/2003 |

* cited by examiner

FIG. 4

| SET LEVEL (W) | CABLE TERMINAL POWER LEVEL (W) | ERROR (W) | ERROR RATE (%) | DECISION |
|---|---|---|---|---|
| 0 | 0 | 0 | 0.00 | OK |
| 100 | 99 | −1 | −1.00 | OK |
| 200 | 199 | −1 | −0.50 | OK |
| 300 | 299 | −1 | −0.33 | OK |
| 400 | 399 | −1 | −0.25 | OK |
| 500 | 500 | 0 | 0.00 | OK |
| 1000 | 1000 | 0 | 0.00 | OK |
| 1500 | 1501 | 1 | 0.07 | OK |
| 1700 | 1701 | 1 | 0.06 | OK |
| 2000 | 2007 | 7 | 0.35 | OK |
| 2500 | 2509 | 9 | 0.36 | OK |
| 3000 | 3009 | 9 | 0.30 | OK |

PLASMA PROCESSING APPARATUS, RADIO FREQUENCY GENERATOR AND CORRECTION METHOD THEREFOR

FIELD OF THE INVENTION

The present invention relates to a plasma processing apparatus, a method for calibrating a radio frequency generator and a radio frequency generator.

BACKGROUND OF THE INVENTION

In a manufacturing process of semiconductor devices, a plasma processing apparatus for performing an etching process or a film forming process on a semiconductor wafer (hereinafter, referred to as a "wafer") by high density plasma generated at a relatively low pressure atmosphere conventionally has been used. For example, in case of a parallel plate type plasma processing apparatus, a pair of parallel plate type electrodes, i.e., an upper electrode and a lower electrode, are disposed in a processing chamber, a processing gas is introduced into the processing chamber and at the same time radio frequency power is supplied to either or both electrodes from a radio frequency generator to generate a radio frequency electric field between the electrodes. The radio frequency electric field forms plasma of the processing gas to thereby perform specified processes such as an etching process and the like on the wafer.

To achieve a desired process result by the plasma processing apparatus described above, it is important to maintain the radio frequency power applied to the electrodes at a specified level during the processing so that the plasma generated in the processing chamber can be stabilized. However, if several plasma processing apparatuses are operating, a power loss of the radio frequency power incurred by a transmission line extending from the radio frequency generator to the electrodes in the processing chamber varies depending on each apparatus even though the output power of the radio frequency generator coupled to each processing apparatus is the same. Therefore, the real radio frequency power applied to the electrodes is not necessarily constant. The different length of the power cable forming the transmission line or the peripheral environment with different electrical characteristics of the plasma processing apparatuses contributes to a variation of the power loss.

If the real radio frequency power applied to the electrodes of the processing chamber varies depending on each plasma processing apparatus, the plasma state in the processing chamber of each apparatus varies, which may result in a variation of accuracy of the processing result of each plasma processing apparatus. Due to this, the radio frequency generator was conventionally calibrated when it is added or replaced so that the output power of the radio frequency generator was adjusted to compensate for a power loss by the transmission line.

The conventional calibration method of the radio frequency generator will be described with reference to the accompanying drawings. FIG. 8 shows a block diagram showing a configuration of a conventional radio frequency generator system for calibrating a radio frequency generator. As shown in FIG. 8, a radio frequency generator 10 is connected to a dummy load (virtual load) 30 via a coaxial cable 20 coupled to a power output terminal 12 for conventional calibration. The dummy load 30 has the same impedance as the combined impedance, e.g., 50Ω, of a real matching unit, to which the radio frequency generator 10 is connected, and the plasma processing apparatus. That is, by connecting the dummy load 30 instead of the real matching unit and plasma processing apparatus, the calibration of the radio frequency generator 10 can be performed efficiently. Further, since the impedance of the load does not change during the calibration process, the calibration result is more reliable.

On the other hand, a power meter 40 is interposed between the end portion of the coaxial cable 20 and the dummy load 30. The power meter 40 measures radio frequency power fed to the dummy load 30.

Connected to the radio frequency generator 10 is a generator control unit 50 for controlling the output power thereof. For example, the generator control unit 50 is included in a controller for controlling the plasma processing apparatus. The generator control unit 50 transmits a power-setting voltage signal 60 to the radio frequency generator 10. The power-setting voltage signal 60 is an analog signal, e.g., having a voltage ranging from 0 V to 10 V. The radio frequency generator 10 generates radio frequency power corresponding to the voltage of the power-setting voltage signal 60 through the power output terminal 12.

Further, the radio frequency generator 10 transmits a power-monitoring voltage signal 62 indicating a voltage of the radio frequency power actually sent from the power output terminal 12 (e.g., a voltage of traveling and reflection waves) to the generator control unit 50. The power-monitoring voltage signal 62 is an analog signal having a voltage ranging, e.g., from 0 V to 10 V. That is, the radio frequency generator 10 outputs the power-monitoring voltage signal 62 corresponding to the voltage of the radio frequency power sent from the power output terminal 12.

The generator control unit 50 includes a display unit (not shown) where the real radio frequency power outputted from the power output terminal 12 (output power level) and set power level according to the voltage level of the power-monitoring voltage signal 62 transmitted from the radio frequency generator 10 are displayed. In this case, the set power level is constant since a specified value is displayed. However, the radio frequency power actually outputted from the power output terminal 12 changes if the output power is changed in calibration of the output power. Due to this, the displayed set power level and the displayed radio frequency power actually outputted are not equal to each other after the output power has been calibrated. Therefore, in this case, it is necessary to adjust the displayed radio frequency power to become the set power level.

A method for calibrating the radio frequency generator 10 using such a radio frequency power system will be described hereinafter. According to this method, the output power of the radio frequency generator 10 is adjusted by the power-setting voltage signal 60 which is an analog signal so that the power actually inputted to the dummy load 30 reaches the set power level of radio frequency power.

First, if an operator enters a power-setting voltage level for the set power level of radio frequency power to an input unit (not shown) of the generator control unit 50, the generator control unit 50 transmits a power-setting voltage signal 60 indicating the power-setting voltage level set in the input unit to the radio frequency generator 10.

FIG. 9 is a graph showing a relationship between the power-setting voltage level to determine the output power of the radio frequency generator 10 and the radio frequency power actually outputted from the power output terminal 12 (output power level) before the output power is calibrated. As shown in FIG. 9, if the radio frequency generator 10 has a rated output of 3000 W, the power-setting voltage level ranging from 0 V to 10 V corresponds to the radio frequency power ranging from 0 W to 3000 W generated from the radio frequency generator 10. That is, when radio frequency power of 1700 W is generated from the radio frequency generator 10, it is noted that a power-setting voltage signal 60 of 5.67 V ($\approx$1700÷3000×10) is fed to the radio frequency generator 10.

The radio frequency generator 10 transmits radio frequency power of 1700 W corresponding to the power-setting voltage signal 60 to the dummy load 30 via the coaxial cable 20. However, due to a power transmission loss caused by the coaxial cable 20, the radio frequency power actually supplied to the dummy load 30 is smaller than 1700 W, the radio frequency power generated from the radio frequency generator 10.

Therefore, the operator adjusts the output power level of the power output terminal 12 by changing the power-setting voltage level inputted to the input unit of the generator control unit 50 so that the radio frequency power actually supplied to the dummy load 30, i.e., the radio frequency power measured by the power meter 40, reaches the set power level. By calibrating the radio frequency generator 10 in this manner, the radio frequency power calibrated to the set power level is fed to the dummy load 30. Then, if the dummy load 30 is disconnected and the matching unit is reconnected to the coaxial cable 20, the radio frequency power calibrated to the set power level is supplied to the matching unit.

(Patent Document 1) Japanese Patent Application Publication No. 5-205898

(Patent Document 2) Japanese Patent Application Publication No. 11-149996

(Patent Document 3) Japanese Patent Application Publication No. 2003-224112

(Patent Document 4) Japanese Patent Application Publication No. 2003-032064

However, according to the conventional correction method of the radio frequency generator 10, the operator has to adjust the power-setting voltage level fed to the input unit of the generator control unit 50 until the radio frequency power supplied to the dummy load 30 reaches the set power level. Further, since an overshoot occurs if the power-setting voltage level is changed too much, the operator has to gradually change the power-setting voltage level several times while monitoring the power meter 40. Accordingly, the calibration process takes a long time.

Furthermore, as described above, since the radio frequency power actually outputted from the power output terminal 12 (output power level) is displayed on the display unit of the power control unit 50, the display of the radio frequency power changes while the output power is being adjusted. Therefore, while the output power is being adjusted, the display of the radio frequency power should be constantly changed to follow the displayed set power level. This process is troublesome in that the calibration process takes more time.

Further, since the power-setting voltage signal 60 transmitted to the radio frequency generator 10 from the generator control unit 50 is an analog signal, it is easily affected by noise. Particular when the set power level of radio frequency power becomes smaller, the power-setting voltage level for adjusting the output power becomes accordingly smaller, which aggravates the noise problem.

In case of the example shown in FIG. 9, if the power-setting voltage signal 60 is overlapped with noise of 10 mV, the radio frequency generator 10 generates the normal radio frequency power added with radio frequency power of 30 W corresponding to the power-setting voltage level of 10 mV. For example, if the normal radio frequency power is 1700 W, noise of 30 W corresponds to approximately 1.8% of 1700 W. However, if the normal radio frequency power is within a low power output range (e.g., if it is 100 W), the noise of 30 W corresponds to 30% of 100 W.

That is, if the target radio frequency power is low, the power-setting voltage signal 60 is significantly affected by the overlapped noise and therefore it may be difficult to accurately control the output power level of the radio frequency generator 10.

Conventionally, techniques for controlling a radio frequency generator during plasma processing such that radio frequency power actually applied to an electrode in a processing chamber reaches a specified value have been proposed to compensate for a power loss by a transmission line. For example, Patent Document 1 discloses a technique for performing plasma processing by supplying radio frequency power to an electrode in a processing chamber from a radio frequency generator via a cable and a matching unit and then controlling the radio frequency generator during plasma processing so that measured radio frequency power actually applied to the electrode reaches a specified value.

Further, Patent Document 2 discloses a technique for performing plasma processing by supplying radio frequency power to an electrode of a plasma reactor from a radio frequency generator via a cable and a matching unit and outputting power added with reflection wave power from the radio frequency generator during plasma processing by measuring the radio frequency power (reflection wave power) actually reflected from the electrode.

In addition, techniques for maintaining real radio frequency power applied to an electrode in a processing chamber at a specified level by controlling a matching circuit disposed between a radio frequency generator and the electrode have been proposed. For example, Patent Document 3 discloses a technique for maintaining real radio frequency power applied to an electrode at a specified level by measuring a current actually flowing to the electrode during plasma processing and by controlling a radio frequency generator or a matching circuit based on the measured current. Further, Patent Document 4 discloses an impedance matching device where power actually supplied to a load is maintained at a specified level by maintaining a circuit passing power loss of a short-circuit resistance at a set power level by controlling the power consumption of the built-in secondary inductance circuit according to power actually supplied to the load during plasma processing.

According to these techniques, the radio frequency power actually applied to the electrode is controlled during plasma processing. Herein, the techniques have been conceived to maintain a constant value of the radio frequency power at the point closest to the electrode to which radio frequency power is finally supplied (i.e., at the point near the electrode seen from the matching unit). Therefore, this is different from the above-described method for calibrating the radio frequency generator by adjusting the output power so that the power fed to the matching unit reaches the set power level when the radio frequency generator is replaced.

Furthermore, attenuation characteristics of the radio frequency power during the transmission thereof from the radio frequency generator to the electrode in the processing chamber are not uniform. For example, if radio frequency power from a radio frequency generator is transmitted to a matching unit via a coaxial cable and then supplied from the matching unit to an electrode in a processing chamber, attenuation characteristics of the radio frequency power in the matching unit and front stage are affected by many parameters unlike the coaxial cable. To be specific, attenuation characteristics for the coaxial cable are largely irrelevant to the size of the radio frequency power and therefore the radio frequency power of any value is attenuated at a constant rate. On the contrary, since attenuation characteristics of the matching unit are depending on the size of the radio frequency power, if the radio frequency power changes, it is likely that its attenuation rate is significantly changed.

Due to this, in case of using only the above-described techniques for adjusting the output power during plasma processing, it is difficult to maintain the radio frequency power applied to the electrode of the processing chamber at a specific value. Further, when the radio frequency generator is added or replaced, the radio frequency power fed to the matching unit should be accurately adjusted by completing the calibration of the radio frequency generator and, after that, the power adjustment of the matching unit and front stage should be performed. Otherwise, it is very difficult to adjust the radio frequency power actually supplied to the electrode in the processing chamber with high accuracy.

Therefore, it is more effective to use the above techniques for adjusting the output power during plasma processing after calibrating the radio frequency generator such that the radio frequency power fed to the matching unit from the radio frequency generator via the transmission line reaches the set power level.

SUMMARY OF THE INVENTION

In view of the above, the present invention provides a plasma processing apparatus capable of significantly reducing time to calibrate output power of a radio frequency generator, for example, when calibrating the radio frequency generator order to compensate for a power loss caused by a transmission line, and also preventing noise effect in calibrating the radio frequency generator.

In accordance with a first aspect of the present invention, there is provided a plasma processing apparatus including a radio frequency generator, which includes a data input terminal to which at least a set power level of radio frequency power and an offset level for calibrating output power are inputted as digital data and a power output terminal for outputting the radio frequency power, capable of adjusting a target output power level based on the set power level and the offset level to output radio frequency power corresponding to the target output power level via the power output terminal; a chamber in which a plasma process is performed on a substrate to be processed by plasma of a processing gas, the plasma being generated by the radio frequency power transmitted from the radio frequency generator via a transmission line and a matching unit; a power detection unit, interposed between the transmission line and the matching unit, for measuring radio frequency power level fed to the matching unit; and a generator control unit for, when calibrating the radio frequency generator, controlling the radio frequency power from the power output terminal of the radio frequency generator such that the radio frequency power level fed to the matching unit reaches the set power level by calculating the offset level based on the difference between the set power level and the power level measured by the power detection unit and transmitting the set power level and the offset level in digital form to the data input terminal of the radio frequency generator.

In accordance with this aspect of the present invention, since the radio frequency generator is provided with a function of adjusting the output power with the offset level, the radio frequency generator can adjust the radio frequency power generated from the power output terminal by using the offset level so that the radio frequency power fed to the matching unit from the radio frequency generator via the transmission line reaches the set power level of the radio frequency power.

In this manner, it is possible to generate a radio frequency power by adjusting it to be, e.g., the power corresponding to the set power level added with the power corresponding to the offset level. Accordingly, the output power can be easily adjusted by adjusting the offset level without changing the set power level of the radio frequency generator.

Further, in calibrating the radio frequency generator, the radio frequency generator can be automatically calibrated by the power control unit because the radio frequency power fed to the matching unit is measured by the power detection unit, the offset level is calculated from the difference between the measured power and the set power level and the output power is offset by the offset level and the set power level. The calibration time of the radio frequency generator can be greatly reduced compared with the conventional method of manually adjusting the set power level by an operator.

Since the set power level and the offset level transmitted from the generator control unit to the radio frequency generator are digital data, noise effect is minimized. Due to this, adjustment accuracy of the radio frequency power generated from the power output terminal of the radio frequency generator can be improved, resulting in that the radio frequency generator can be accurately adjusted regardless the size of a transmission loss so that the radio frequency power fed to the matching unit can reach the set power level.

Further, because the generator control unit can receive the radio frequency power, which is fed to the matching unit, directly from the power detection unit, the power can be displayed on the display unit of the generator control unit. That is, since the output power level from the radio frequency generator is not displayed unlike the conventional case, it is not necessary to modify the displayed output power level so that the displayed output power level can be equal to the radio frequency power fed to the matching unit whenever the set power level is manually adjusted. Therefore, it is possible to skip the troublesome task and save the time for display calibration.

Further, the transmission line may be formed of a coaxial cable. If the coaxial cable is used for the transmission line, it is possible to prevent radio frequency noise from leaking from the radio frequency power.

The digital data may be serial data. Therefore, the set power level and the offset level can be transmitted through a communication network with general usability and extensibility.

Further, the radio frequency generator may calculate the target output power level by multiplying the set power level with the offset level. According to this, less computation resources are needed to calculate the target output power level.

The radio frequency generator may include a radio frequency power stabilizing circuit that stabilizes the radio frequency power from the power output terminal to be maintained at the target output power level. According to this, the radio frequency power fed to the matching unit from the power output terminal of the radio frequency generator via the transmission line is further stabilized.

In accordance with a second aspect of the present invention, there is provided a plasma processing apparatus including: a radio frequency generator, which includes a power output terminal for outputting radio frequency power, capable of adjusting a target output power level based on a set power level of radio frequency power and an offset level for calibrating output power to output radio frequency power corresponding to the target output power level via the power output terminal; a chamber in which a plasma process is performed on a substrate to be processed by plasma of a processing gas, the plasma being generated by the radio frequency power transmitted from the radio frequency generator via a transmission line and a matching unit; and a power detection unit, interposed between the transmission line and the matching unit, for measuring radio frequency power level fed to the matching unit, wherein the radio frequency generator retains an automatic calibration function of adjusting the radio frequency power from the power output terminal of the radio frequency generator such that the radio frequency power level fed to the matching unit reaches the set power level by receiving a power level measured by the power detection unit, calculating the offset level based on the difference between the measured power level and the set power level, and adjusting the target output power level based on the offset level and the set power level.

In accordance with this aspect of the present invention, the radio frequency generator can automatically offset the radio frequency power generated from the power output terminal of the radio frequency generator only by receiving the power measured by the power detection unit. Therefore, at least the radio frequency generator can perform an automatic calibration to automatically offset the output power.

In accordance with a third aspect of the present invention, there is provided a method for calibrating a radio frequency generator to which a load is connected via a transmission line by using a generator control unit, wherein the radio frequency generator includes a data input terminal to which at least a set power level of radio frequency power and an offset level for calibrating output power are inputted as digital data and a power output terminal for outputting the radio frequency power, a target output power level is adjusted based on the set power level and the offset level, and radio frequency power corresponding to the target output power level is outputted via the power output terminal.

Herein, the method includes: adjusting the target output power level by inputting a set power level for calibration and an offset level for calibration to the data input terminal of the radio frequency generator by the generator control unit and outputting radio frequency power corresponding to the target output power level via the power output terminal; renewing the offset level for calibration based on the difference between radio frequency power applied to the load, which has been measured by a power detection unit interposed between the transmission line and the load, and the set power level by the generator control unit to transmit the renewed offset level for calibration to the data input terminal of the radio frequency generator; repeating the step of renewing the offset level for calibration to transmit it until the measured power reaches the set power level; and setting the offset level for calibration when the measured power reaches the set power level as an offset level for calibrating the output power of the radio frequency generator.

In accordance with this aspect of the present invention, since the offset level is modified whenever each process is repeated, the radio frequency power fed to the load, i.e., the measured power, gradually reaches the set power level. Further, the offset level for calibration when the radio frequency power fed to the load, i.e., the measured power, reaches the set power level is fixed as an offset level for calibrating the output power of the radio frequency generator. By using the fixed offset level afterwards, any set power level can be compensated for the power loss caused by the transmission line and therefore the final radio frequency power fed to the load can reach the set power level.

In accordance with a fourth aspect of the present invention, there is provided a method for calibrating a radio frequency generator to which a load is connected via a transmission line, wherein the radio frequency generator includes a power output terminal for outputting radio frequency power, and is configured such that a target output power level is adjusted based on a set power level of radio frequency power and an offset level for calibrating output power and radio frequency power corresponding to the target output power level is outputted via the power output terminal.

Herein, the method includes adjusting the target output power level based on a set power level for calibration and an offset level for calibration by the generator control unit to output radio frequency power corresponding to the target output power level via the power output terminal of the radio frequency generator; renewing the offset level for calibration based on the difference between radio frequency power applied to the load, which has been measured by a power detection unit interposed between the transmission line and the load, and the set power level by the radio frequency generator; repeating the step of renewing the offset level for calibration until the measured power reaches the set power level; and setting the offset level for calibration when the measured power reaches the set power level as an offset level for calibrating the output power of the radio frequency generator.

In accordance with this aspect of the present invention, since the offset level is modified whenever each process is repeated, the radio frequency power fed to the load, i.e., the measured power, gradually reaches the set power level. Further, the offset level for calibration when the radio frequency power fed to the load, i.e., the measured power, reaches the set power level is fixed as an offset level for calibrating the output power of the radio frequency generator. By using the fixed offset level afterwards, any set power level can be compensated for the power loss caused by the transmission line and therefore the final radio frequency power fed to the load can reach the set power level. Further, in accordance with the radio frequency generator of the present invention, the radio frequency power from the power output terminal of the radio frequency generator can be automatically calibrated by the power measured from the power detection unit. Therefore, it is possible to perform an automatic correction for automatically offset-adjusting the output power by only using the radio frequency generator.

It is preferable that the offset level for calibration changes according to a half of the difference between the measured power and the set power level. According to this, whenever each process is repeated, the difference between the radio frequency power fed to the load and the set power level decreases by a half. The radio frequency power which is accurately adjusted to the set power level can be fed to the load, accordingly.

Further, it is preferable that the load includes a chamber in which a plasma process is performed on a substrate to be processed by plasma generated by radio frequency power supplied from the radio frequency generator via the transmission line and a matching unit, installed between the transmission line and the chamber, for matching the impedance between the chamber and the transmission line. By calibrating the radio frequency generator in the real plasma processing apparatus in this way, the plasma processing apparatus can operate as soon as the offset level for calibrating the output power of the radio frequency generator is fixed. Furthermore, the load may be configured as a pseudo load or a dummy load.

In accordance with a fifth aspect of the present invention, there is provided a radio frequency generator including: an oscillator; a level adjustment unit for adjusting an output level of the oscillator; an amplifying unit for amplifying an output from the level adjustment unit; a power output terminal for transmitting radio frequency power from the amplifying unit; a data input terminal to which at least a set power level of the radio frequency power and an offset level for calibrating the output power from the power output terminal are inputted as digital data; and a power control unit that calculates a target output power level based on the set power level and offset level inputted to the data input terminal, and controls the level adjustment unit such that radio frequency power corresponding to the target output power level is outputted via the power output terminal.

In accordance with this aspect of the present invention, the output power can be adjusted based on the set power level and offset level entered to the data input terminal. For example, in calibrating the radio frequency generator, the power loss caused by the transmission line can be compensated for by inputting the set power level and offset level to the data input terminal from outside, and therefore the output power can be adjusted so that the final radio frequency power fed to the load reaches the set power level.

In accordance with a sixth aspect of the present invention, there is provided a radio frequency generator including: an oscillator; a level adjustment unit for adjusting an output level of the oscillator; an amplifying unit for amplifying an output from the level adjustment unit; a power output terminal for transmitting radio frequency power from the amplifying unit to a transmission line; and a power control unit that receives power measured by a power detection unit connected to an end portion of the transmission line, calculates an offset level by using the difference between the measured power and a set power level of radio frequency power, computes a target output power level based on the offset level and the set power level, and controls the level adjustment unit such that radio frequency power corresponding to the target output power level is outputted via the power output terminal.

In accordance with this aspect of the present invention, the radio frequency power can be automatically adjusted by only inputting the power measured by the power detection unit connected to the end portion of the transmission line. Therefore, since it is possible to compensate for the power loss caused by the transmission line by using only the radio frequency generator, the output power can be adjusted so that the radio frequency power at the end portion of the transmission line can reach the set power level.

In accordance with the present invention, the output power of the radio frequency generator is calibrated, e.g., in order to compensate for the power loss caused by the transmission line, time to calibrate the radio frequency generator can be greatly reduced compared with the conventional case. Further, since noise effect in calibrating the radio frequency generator can be prevented, the calibration of the output power in a low power output range as well as a high power output range can be performed with high accuracy.

BRIEF DESCRIPTION OF THE DRAWINGS

The above features of the present invention will become apparent from the following description of embodiments given in conjunction with the accompanying drawings, in which:

FIG. 4 is a table showing results obtained by applying several power values as the set power levels to a radio frequency generator to thereby measure cable terminal power levels;

DETAILED DESCRIPTION OF THE EMBODIMENTS

Figure 1:
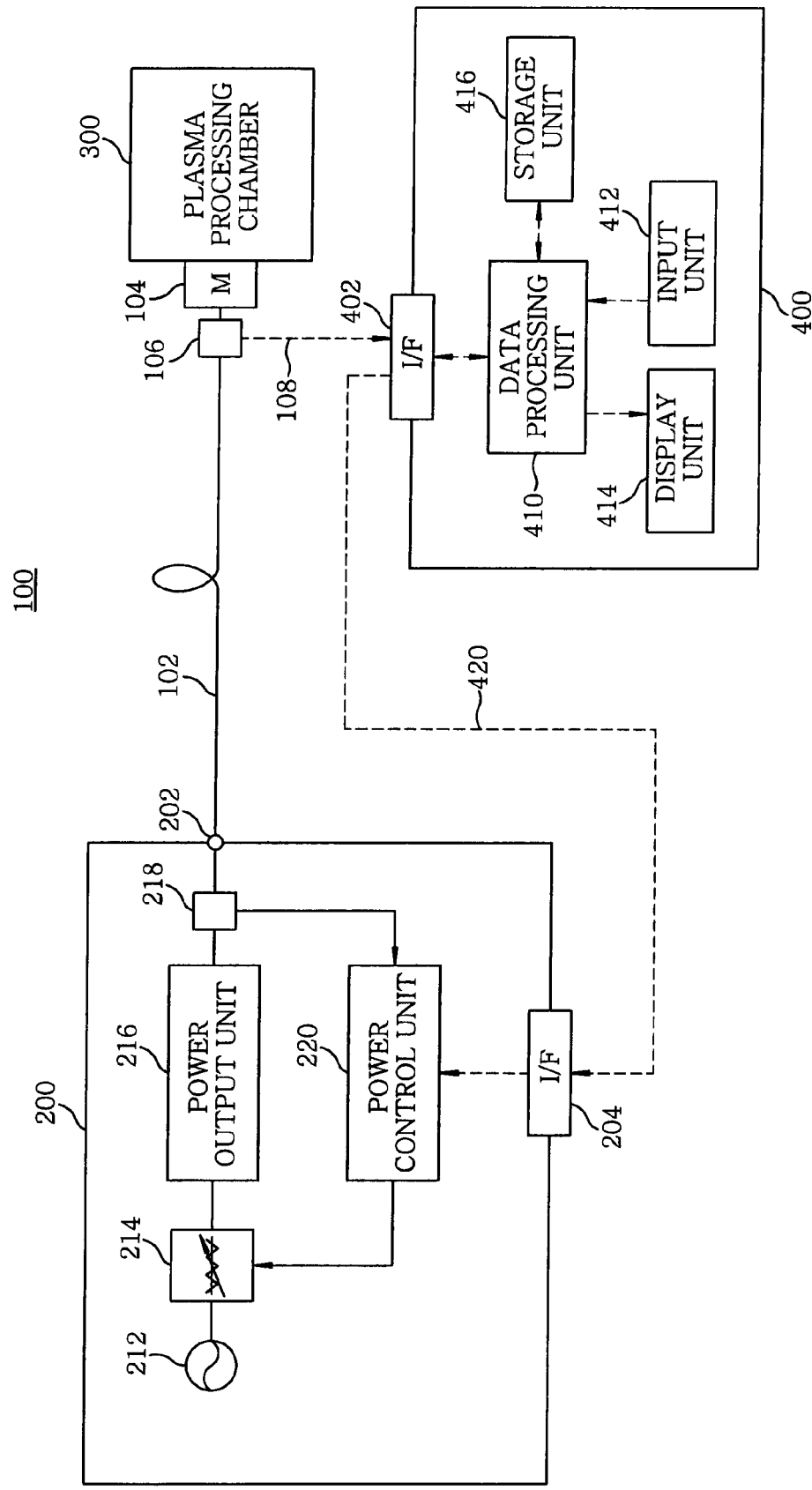
FIG. 1 is a block diagram showing a configuration of a plasma processing apparatus of the first embodiment of the present invention.

Hereinafter, embodiments of the present invention will be described in detail with reference to the accompanying drawings, which forms a part hereof. Further, like reference numerals will be assigned to like parts having substantially the same functions, and the description thereof will not be repeated.

(Configuration of Plasma Processing Apparatus in First Embodiment)

First, the configuration of a plasma processing apparatus 100 in accordance with the first embodiment of the present invention will be described with reference to the drawings. FIG. 1 is a block diagram showing the configuration of the plasma processing apparatus 100 in accordance with the first embodiment of the present invention.

As shown therein, the plasma processing apparatus 100 includes a radio frequency generator 200; a coaxial cable 102 whose one end is coupled to a power output terminal 202 of the radio frequency generator 200; a matching unit 104 connected to the other end of the coaxial cable 102; and a plasma processing chamber (hereinafter, simply referred to as a "chamber") 300 connected to the matching unit 104. The plasma processing apparatus 100 also includes a power detection unit 106 interposed between the other end of the coaxial cable 102 and the matching unit 104; and a generator control unit 400 connected both to the power detection unit 106 and to the radio frequency generator 200.

The radio frequency generator 200 includes an oscillator 212; an attenuator (level adjustment unit) 214 for adjusting the level of a radio frequency signal from the oscillator 212; and a power output unit (amplifying unit) 216 for amplifying the radio frequency signal whose level has been adjusted by the attenuator 214 to transmit the amplified signal (i.e., radio frequency power) via the power output terminal 202. Further, the radio frequency generator 200 includes a power sensor 218 for detecting a value of the radio frequency power (which is maintained at a "target output power level" as described later) outputted from the power output terminal 202; and a power control unit 220 connected both to the power sensor 218 and to the attenuator 214.

The power output unit 216 is configured by, e.g., a preamplifier or a low pass filter. Further, the power control unit 220 is configured by, e.g., a DSP (Digital Signal Processor). By the power control unit 220 configured by a DSP, the radio frequency power to be outputted from the power output terminal 202 can be controlled with high accuracy and speed.

Further, the radio frequency generator 200 is provided with an interface unit (hereinafter, referred to as an "I/F unit") unit 204 serving as a data input terminal for digital communications with external devices. The I/F unit 204 is connected to an internal circuitry of the power control unit 200. When receiving a power supply control signal 420 from the generator control unit 400, the I/F unit 204 sends it to the power control unit 220.

Figure 2:
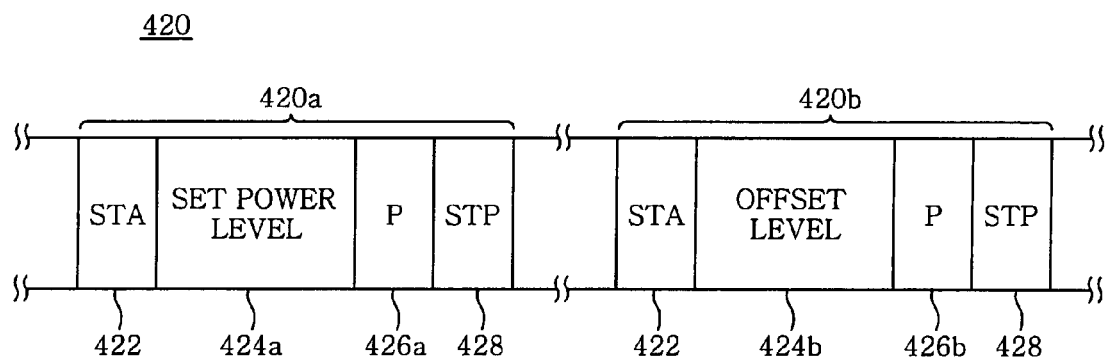
FIG. 2 shows an exemplary data structure of a power supply control signal.

FIG. 2 shows an exemplary data configuration of the power supply control signal 420 in case of serial transmission. As shown therein, the power supply control signal 420 includes a set power level data 420a, which contains a set power level 424a indicating a radio frequency power set according to plasma processing conditions and the like; and an offset level data 420b for calibrating the output power of the radio frequency generator 200 according to power loss. To control the radio frequency generator 200 by the generator control unit 400, at least one of the set power level data 420a and the offset level data 420b is transmitted to the radio frequency generator 200 when necessary. For the calibration of the radio frequency generator 200 configured as shown in FIG. 1, the power supply control signal 420 including both the set power level data 420a and the offset level data 420b is transmitted.

In this data structure, the set power level data 420a has a parity bit 426a located next to the set power level 424a; a start bit 422 located at the beginning; and a stop bit 428 located at the end. The offset level data 420b has a parity bit 426b located next to the offset level 424b; a start bit 422 located at the beginning; and a stop bit 428 located at the end in the same manner as the set power level data 420a.

Further, the transmission sequence of the set power level data 424a and the offset level data 424b is not limited to the example of FIG. 2. For example, the power supply control signal 420 may include a single data having the set power level 424a and the offset level 424b combined together.

The power control unit 220 controls the target output power level based on the set power level 424a and offset level 424b of the power supply control signal 420 transmitted in a digital form from the generator control unit 400. The set power level 424a and the offset level 424b are stored in a storage unit (not shown) such as a memory or the like installed in the power control unit 220.

Figure 3:
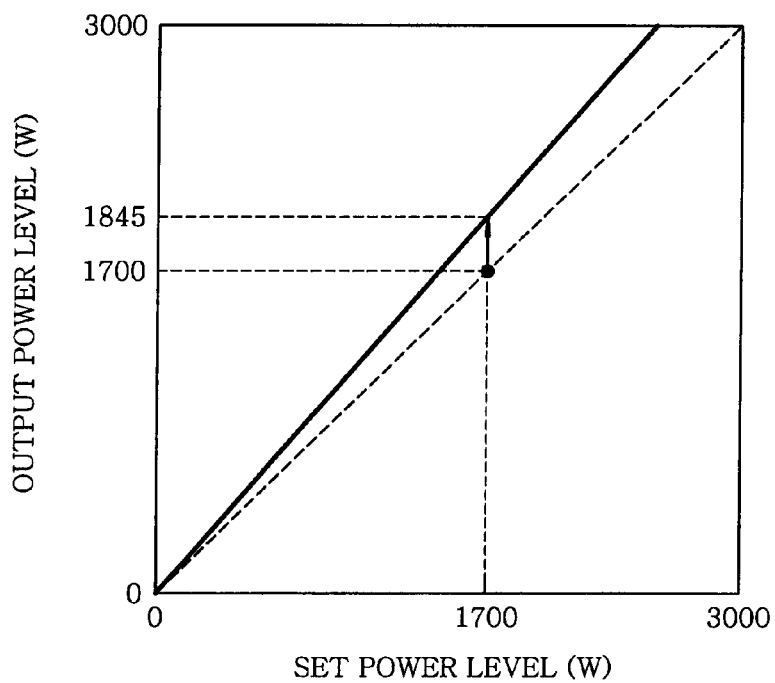
FIG. 3 is a graph showing a relationship between the set power level and the target output power level.

Hereinafter, explanations will be given as to a case where an offset level is set by a ratio of an output power level (radio frequency power from the power output terminal 202) to a set power level. FIG. 3 is a graph showing a relationship between the set power level 424a and the output power level (target output power level) outputted from the power output terminal 202. The dashed line in FIG. 3 indicates the set power level 424a depending on the output power level when the offset level 424b in the power supply control signal 420 is an initial value (which is equal to 1 in this example). In this case, if the set power level 424a is 1700 W, the output power level is obtained by multiplying the offset level (i.e., 1) with the set power level 424a (i.e., 1700 W).

A Conventional radio frequency generator sets the set power level to be the target output power level such that a radio frequency power corresponding to the target output power level is outputted from the power output terminal. In the radio frequency generator 200 of the present embodiment, an initial offset level is set to be a default value (which is equal to 1 in this example) such that the output level is equal to that of the conventional radio frequency generator.

Further, the output power outputted from the power output terminal 202 of the radio frequency generator 200 can be calibrated by adjusting the offset level according to the operating state of the radio frequency generator 200 such as the power loss. For example, as shown in FIG. 3, if the offset level becomes greater than 1, the slope of the line indicating the target output power level as a function of the set power level 424a becomes steeper. The solid line of FIG. 3 indicates the target output power level depending on the set power level 424a in case the offset level is 1.0850. If, for example, the set power level 424a is 1700 W, the output power level is about 1845 W, which is obtained by multiplying the offset level (i.e., 1.0850) with the set power level 424a (i.e., 1700 W).

Further, the power control unit 220 has a so-called control loop for maintaining the target output power level at a constant level by controlling the level adjustment operation of the attenuator 214 based on the power measured by the power sensor 218 by, for example, adjusting an output gain of the oscillator 212 by feedback of the measured power. Therefore, once the target output power level is determined by the set power level 424a and offset level 424b contained in the power supply control signal 420, radio frequency power outputted from the power output terminal 202 is maintained accurately at the target output power level by the control loop (i.e., a radio frequency power stabilizing circuit).

The coaxial cable 102 connecting the radio frequency generator 200 and the matching unit 104 forms a radio frequency power transmission line to transmit radio frequency power from the radio frequency generator 200 to the matching unit 104.

The matching unit 104, which is configured by an inductor or a capacitor, matches the impedance between the radio frequency generator 200 and the chamber 300. By matching the impedance with the matching unit 104, reflection of the radio frequency power from the radio frequency generator 200 is suppressed so that the radio frequency power can be efficiently transmitted to an electrode (not shown) in the chamber 300.

The chamber 300 is provided with the electrode to which the radio frequency power from the radio frequency generator 200 is supplied. If the specified radio frequency power is supplied to the electrode, plasma is generated in the chamber 300 to perform plasma processing on the wafer. The configuration of the chamber 300 will be described in detail later.

The power detection unit 106 measures radio frequency power fed to the matching unit 104, and transmits a power detection signal 108 having the measurement result to the generator control unit 400. It is preferable that the power detection unit 106 transmits the power detection signal 108 in a digital form to the generator control unit 400.

The radio frequency generator 400 includes an I/F unit 402 for serial communication with external devices and a data processing unit 410 for data processing for various data from the I/F unit 402 or an input unit 412 to be described later and transmitting the result data to the I/F unit 402 or a display unit 414 to be described later. The radio frequency generator 400 is also provided with the input unit 412 through which an operator enters or edits various data such as power supply setting parameters; a display unit 414 configured by a liquid crystal display showing an operating display, a selected display or the like; and a storage unit 416 for storing the data which is inputted through the input unit 412 and then processed by the data processing unit 410, data calculated by the data processing unit 410 and the like.

The generator control unit 400 is included in a controller for controlling operations of the entire plasma processing apparatus 100. However, the generator control unit 400 is not limited thereto, but it may be configured as an independent unit.

The data processing unit 410 of the generator control unit 400 forms the power supply control signal 420 with the set power level 424a and the offset level 424b. The set power level 424a may be stored in the storage unit 416 of the generator control unit 400 in advance or it may be entered to the input unit 412 by the operator.

Further, the data processing unit 410 of the generator control unit 400 obtains a cable terminal power level Pe at the end of the coaxial cable 102 based on the power detection signal 108 from the power detection unit 106, and then calculates the difference Ps-Pe between the cable terminal power level Pe and the set power level Ps. The data processing unit 410 also calculates the offset level 424b by applying the difference to a specified equation. In the present embodiment, the offset level 424b is obtained by adding 1 to the ratio between a half of the difference and the set power level Ps. The offset level P(offset) can be expressed by the following Eq. 1.

$$P(\text{offset}) = (1 + (Ps - Pe)/2Ps) \quad \text{Eq. 1}$$

The I/F unit 402 of the generator control unit 400 is connected to the I/F unit 204 of the radio frequency generator 200 and the power detection unit 106 via a transmission line for digital communication (e.g., a signal line). Serial or parallel communication may be adopted for the digital communication. In case of serial communication, the transmission line conforms to the RS-232C or DeviceNet (Registered trademark) standard. In case of parallel communication, the transmission line conforms to the GP-IB (IEEE488) standard. Further, the transmission line may be implemented according to Ethernet (Registered trademark) for more general use. It is preferable that the I/F unit 402 of the generator control unit 400 and the I/F unit 204 of the radio frequency generator 200 use the transmission method that allows two-way communication but the one-way communication method may also be used.

Noise resistance of the communication data can be improved by the digital communication between the generator control unit 400 and the radio frequency generator 200 and between the generator control unit 400 and the power detection unit 106

(Correction of Radio Frequency Generator in First Embodiment)

Next, the calibration of the radio frequency generator 200 of the plasma processing apparatus 100 configured as described above will be described with reference to the drawings. In accordance with the correction of the radio frequency generator 200 in the present embodiment, the radio frequency power from the power output terminal 202 of the radio frequency generator 200 is adjusted by offsetting such that the radio frequency power fed to the matching unit 104 via the coaxial cable 102 becomes equal to the set power level of radio frequency power.

Since the radio frequency power from the radio frequency generator 200 is consumed while flowing through the coaxial cable 102 (i.e., a power loss occurs there), the actual radio frequency power fed to the matching unit 104 is smaller than the set power level. Therefore, the correction as mentioned above is performed to compensate for the power loss. Further, the power consumed by the coaxial cable 102 depends on electrical characteristics of the coaxial cable 102. Therefore, if a different coaxial cable having different electrical characteristics is used to connect the radio frequency generator 200 to the matching unit 104, the actual radio frequency power fed to the matching unit 104 becomes different to a non-negligible degree even when the difference in the electrical characteristics is very slight.

However, in accordance with the present embodiment, when the radio frequency generator 200 is newly installed or replaced in the plasma processing chamber 100, the radio frequency power fed to the matching unit 104 can be adjusted to be the set power level of the radio frequency power by correcting the radio frequency generator 200. Therefore, the radio frequency power with the set power level can be stably supplied to the electrode in the chamber 300, thereby achieving stabilization of plasma in the chamber 300.

Hereinafter, the calibration method of the radio frequency generator 200 in accordance with the embodiment will be described in detail. In the plasma processing apparatus 100, after the radio frequency generator 200 is connected to the matching unit 104 via the coaxial cable 102, the operator enters commands to the input unit 412 so that the generator control unit 400 starts the calibration of the radio frequency generator 200.

When the generator control unit 400 receives the commands, the data processing unit 410 creates a power supply control signal 420 containing the set power level 424a for calibration and the offset level 424b for calibration. In this case, if the set power level of the radio frequency generator 200 is limited within a range from, e.g., 0 W to 3000 W, the set power level 424a for calibration is selected from the range, and the power supply control signal 420 including data of the selected set power level 424a is created. The set power level 424a may be stored in the storage unit 416 of the generator control unit 400 in advance, or it may be inputted to the input unit 412 with the commands for calibration by the operator. In the present embodiment, the set power level 424a for calibration is 1700 W.

Further, the initial offset level 424b for calibration contained in the first power supply control signal 420 is a default value (which is equal to 1 in this example). This intends to output the first radio frequency power with the set power level 424a via the power output terminal 202.

The power supply control signal 420 created in this way is sent from the I/F unit 402 of the generator control unit 400 to the I/F unit 204 of the radio frequency generator 200 via a serial transmission line. The I/F unit 204 transmits the power supply control signal 420 to the power control unit 220. Upon receiving the power supply control signal 420, the I/F unit 204 or the power control unit 220 checks an error of the set power level 424a and offset level 424b based on the parity bits 426a and 426b, and it may request the generator control unit 400 to resend the power supply control signal 420 if there is an error.

The power control unit 220 receives the power supply control signal 420 from the I/F unit 204, and reads the set power level (i.e., the set power level 424a for calibration) and the offset level (i.e., the offset level 424b for calibration). In the initially received power supply control signal 420 of the present embodiment, the set power level 424a for calibration is 1700 W and the offset level 424b for calibration is 1. Therefore, the power control unit 220 controls the level adjustment operation of the attenuator 214 in order that 1700 W obtained by multiplying the offset level 424b with the set power level 424a is set to be the target output power level.

After the radio frequency signal whose level is adjusted by the attenuator 214 is amplified by the power output unit 216, and then its frequency is adjusted, it is transmitted outside via the power output terminal 202. The output power level of the signal is constantly measured by the power sensor 218 to be feedback-controlled by the power control unit 220. Based thereon, the level adjustment operation of the attenuator 214 is controlled so that the output power level can be stabilized at the target output power level of 1700 W.

In this way, radio frequency power of 1700 W from the radio frequency generator 200 is fed to the matching unit 104 via the coaxial cable 102. At that time, due to the power loss in the coaxial cable 102, the cable terminal power level Pe of the coaxial cable 102 (i.e., the radio frequency power actually fed to the matching unit 104) is smaller than 1700 W (e.g., 1600 W). In this case, the power loss in the coaxial cable 102 is generally 100 W.

The power detection unit 106 measures the cable terminal power level Pe (e.g., 1600 W), and transmits the power detection signal 108 containing the measurement result to the generator control unit 400. The power detection signal 108 is received by the I/F unit 402 of the generator control unit 400. The I/F unit 402 then transmits the power detection signal 108 to the data processing unit 410.

The data processing unit 410 obtains the cable terminal power level Pe from the power detection signal 108, and then calculates the difference between the cable terminal power level Pe and the set power level Ps for calibration. Further, the data processing unit 410 calculates the offset level P by applying the difference to a specified equation (e.g., Eq. 1). In the present embodiment, the offset level 424b is renewed by adding 1 to the ratio between a half of the difference and the set power level for calibration, as described above.

To be more specific, since the cable terminal power level Pe is 1600 W and the set power level Ps for calibration is 1700 W in the present embodiment, the difference calculated by the data processing unit 410 is 100 W. Then, the offset level 424b for calibration is renewed to 1.0294 by adding 1 to the ratio between a half of the difference 100 W (which is equal to 50 W) and the set power level for calibration (i.e., 1700 W). A power supply control signal 420 with the renewed data is transmitted to the radio frequency generator 200. However, the set power level (i.e., the set power level 424a for calibration) is not changed.

The power control unit 220 of the radio frequency generator 200 reads the set power level (i.e., the set power level 424a for calibration) and the offset level (i.e., the offset level 424b for calibration) contained in the renewed power supply control signal 420 in the same manner as when it first received the power supply control signal 420. Since the offset level 424b is renewed as described above, the power control unit 220 obtains a new offset level 424b.

In the power supply control signal 420 of the present embodiment, the set power level (i.e., the set power level 424a for calibration) is 1700 W, and the offset level 424b is 1.0294. Therefore, the power control unit 220 controls the level adjustment operation of the attenuator 214 so that 1750 W obtained by multiplying the offset level 424b with the set power level 424a becomes equal to a target output power level.

Thus, after the radio frequency power of 1750 W is generated from the radio frequency generator 200, it is supplied to the matching unit 104 via the coaxial cable 102. Herein, there occurs a power loss in the cable terminal power level. However, the output power from the power output terminal 202 increases, so that the difference between the cable terminal power level and the set power level for calibration becomes smaller than the initial difference.

The power detection unit 106 measures the cable terminal power level and transmits the power detection signal 108 having the measurement result to the generator control unit 400. Then, the generator control unit 400 renews the offset level 424b for calibration contained in the power supply control signal 420, and then the power control unit 220 of the radio frequency generator 200 adjusts the offset level for calibration. By repeating this process, the cable terminal power level reaches the set power level for calibration in the end.

The offset level 424b at that time is fixed as an offset level for calibrating the output power, is stored in the storage unit 416 in the generator control unit 400, and is displayed on the display unit 414. In the present embodiment, the fixed offset level is, e.g., 1.0850. Once the offset level is fixed as above, the calibration of the radio frequency generator 200 is completed.

The calibration of the radio frequency generator 200 in the present embodiment is performed by adjusting the offset level of output power with respect to the set power level 424a, i.e., the ratio of the output power level to the set power level 424a. Here, the offset level at the beginning of calibration of the radio frequency generator 200 is 1, which is indicated by the slope of the dashed line in FIG. 3.

Further, when the calibration of the radio frequency generator 200 is completed, the offset level is greater than 1 as indicated by the arrow in the graph of FIG. 3. If, for example, the offset level is 1.0850, when the generator control unit 400 applies a set power level of 1700 W to the radio frequency generator 200, the radio frequency generator 200 generates a target output power level of about 1845 W.

That is, in accordance with the embodiment, the set power level for calibration is selected, e.g., 1700 W, from the set power level ranging from, e.g., 0 W to 3000 W, and the offset level for calibrating the output power can be obtained by using the set power level for calibration. The same offset level is also applied to other set power level than the set power level for calibration. Therefore, as indicated by the solid line in FIG. 3, for any set power level applied to the radio frequency generator 200, radio frequency power obtained by multiplying the offset level with that set power level is generated by the radio frequency generator 200.

However, the radio frequency power from the radio frequency generator 200 is attenuated while flowing through the coaxial cable 102. The offset level fixed by calibrating the radio frequency generator 200 in the embodiment is based on an attenuation rate of the set power level for calibration used when the offset level was calculated with respect to the coaxial cable 102. It is assumed that an attenuation rate of radio frequency power for the coaxial cable 102 is constant regardless of the size of the radio frequency power.

Therefore, once an offset level is obtained from the set power level for calibration, the fixed offset level is applied to any set power level set for the radio frequency generator 200. Thus, radio frequency power in which the attenuated power in the coaxial cable 102 is compensated for is generated from the radio frequency generator 200, so that the cable terminal power level is adjusted to the set power level. In accordance with the embodiment, the radio frequency generator 200 can be calibrated by fixing only a single offset level. In short, one-point calibration is realized.

In order to confirm whether the radio frequency generator 200 is accurately calibrated by one-point calibration of the embodiment, an offset level was fixed by using a single set power level for calibration (e.g., 1700 W), and then several cable terminal power levels were measured by applying several power values within a range from 0 W to 3000 W to the radio frequency generator 200. The results are shown in FIG. 4.

As shown in FIG. 4, by applying the fixed offset level to the entire set power levels, the adjusted cable terminal power levels were obtained. To be specific, error rates of the cable terminal power level to the set power level are within a range of ±1%, which is allowable. As apparent from the above results, the radio frequency generator 200 is accurately calibrated by the one-point calibration. Therefore, as for all the set power levels within the range from 0 W to 3000 W as well as the set power level for calibration (i.e., 1700 W), the radio frequency generator 200 can supply radio frequency power adjusted to the set power level with high accuracy to the matching unit 104.

As described above, for the calibration of the radio frequency generator 200, it is preferable to adjust the output power of the radio frequency generator 200 such that radio frequency power fed to the matching unit 104 reaches the set power level. In contrast, it is not preferable to calibrate the radio frequency generator 200 by installing the power detection unit 106 between the matching unit 104 and the chamber 300 and then measuring radio frequency power supplied to the electrode in the chamber 300. One of the reasons is that inaccurate calibration results may be obtained by using a single set power level for calibration, i.e., by one-point calibration, as in the present embodiment.

To be specific, although the power detection unit 106 is installed between the matching circuit 104 and the chamber 300, if a set power level for calibration is applied to the radio frequency generator 200 and the radio frequency generator 200 is calibrated in the same manner as in the present embodiment, an offset level is obtained. However, this offset level is effective only for a single set power level for calibration. If this offset level is applied to any other set power level other than the set power level for calibration, radio frequency power which is significantly different from the set power level may be measured by the power detection unit 106. It is probably because an attenuation rate of radio frequency power in the matching unit 104 highly depends on the size of the radio frequency power fed to the matching unit 104.

The matching unit 104 adjusts the inner impedance to match the impedance between the chamber 300 and the radio frequency generator 200. If radio frequency power fed to the matching unit 104 changes, the plasma state of the chamber 300 also changes. If the plasma state changes, the impedance of the chamber 300 also changes and therefore the matching unit 104 adjusts the inner impedance for impedance matching. As a result, the attenuation rate of radio frequency power passing through the matching unit 104 changes as the inner impedance of the matching unit 104 changes.

If the attenuation rate of radio frequency power in the matching unit 104 depends on the size of the radio frequency power fed to the matching unit 104, the radio frequency power measured by the power detection unit 106 may be adjusted or not to be the set power level depending on the size of the set power level of the radio frequency generator 200. The radio frequency generator 200 is not accurately calibrated, and even though the radio frequency generator 200 in this state is used, desired radio frequency power may be not stably supplied to the electrode in the chamber 300.

For this reason, if the power detection unit 106 is installed between the matching circuit 104 and the chamber 300, it is necessary that several set power levels are applied to the radio frequency generator 200 and the calibration in accordance with the embodiment is performed for each set power level to produce several offset levels. For example, by using the slope of the regression line derived from several offset levels as an offset level, for any set power level applied to the radio frequency generator 200, power close to the set power level is measured by the power detection unit 106.

However, if the radio frequency generator 200 is calibrated by using several set power levels applied to the radio frequency generator 200 (that is, so-called multi-point calibration is performed), the calibration takes much more time than the one-point calibration of the embodiment. Therefore, the starting time of operation of the plasma processing apparatus 100 is delayed, which results in a decrease in the operation rate of the apparatus.

Further, although the power detection unit 106 is installed between the matching unit 104 and the chamber 300 and the multi-point calibration of the radio frequency generator 200 is completed, if radio frequency power is attenuated depending on the size of it between the power detection unit 106 and the electrode, another circuit adjustment to compensate for the attenuated power is required. In this case, the long-time multi-point calibration of the radio frequency generator 200 becomes ineffective.

Furthermore, when the calibration of the radio frequency generator 200 is first performed, a processing gas is not introduced to the chamber 300 and plasma is not generated. That is, the conditions are different from when radio frequency power is applied. Although radio frequency power at some point between the matching unit 104 and the chamber 300 is measured and the radio frequency generator 200 is calibrated based on the measured result, the radio frequency power at that point may be changed by operation of the matching unit 104 when plasma processing is performed. Therefore, for the case the multi-point calibration as well as the one-point calibration, some point between the matching unit 104 and the chamber 300 is not suitable as a reference point for calibration.

In the present embodiment, a point where the coaxial cable 102 is connected to the matching unit 104 is set as a point which is the closest point to the electrode of the chamber 300 allowing one-point calibration of the radio frequency generator 200. The power detection unit 106 is installed at that point and radio frequency power measured by the power detection unit 106 is adjusted to the set power level applied to the radio frequency generator 200.

Further, the calibration of the radio frequency generator 200 can be completed by only selecting a single set power level from the entire set power levels and fixing an offset level using the set power level. In accordance with the embodiment, multi-point calibration is not needed so that the calibration time of the radio frequency generator 200 can be reduced.

On the other hand, circuit adjustment to compensate for radio frequency power attenuated between the matching unit 104 and the electrode of the chamber 300 needs to be performed. In the present embodiment, since the radio frequency generator 200 is accurately calibrated in regard to the point between the coaxial cable 102 and the matching unit 104, the circuit adjustment can be performed easily and accurately. As a result, desired radio frequency power can be stably supplied to the electrode in the chamber 300 during plasma processing, thereby forming uniform plasma in the chamber 300.

Further, in accordance with the present embodiment, once an operator enters commands to the generator control unit 400 to start calibration of the radio frequency generator 200, the radio frequency generator 200, the generator control unit 400 and the power detection unit 106 automatically cooperate to calibrate the radio frequency generator 200. Compared with the conventional manual operation by an operator, the calibration time is significantly reduced. Therefore, when the radio frequency generator 200 is added or replaced in the plasma processing chamber 100, the plasma processing apparatus 100 can fully operate in a short time, thereby improving the operation rate of the apparatus.

The radio frequency generator 200 may be calibrated only when the radio frequency generator 200 is attached to the plasma processing apparatus 100 and connected to the matching unit 104. If power applied to the electrode in the chamber 300 changes afterwards, by changing the set power level, radio frequency power corresponding to the changed set power level is supplied to the matching unit 104. Therefore, the radio frequency generator 200 does not need to be calibrated again.

In the plasma processing apparatus 100 of the embodiment, the generator control unit 400 receives the power detection signal 108 from the power detection unit 106 and obtains radio frequency power fed to the matching unit 104. The generator control unit 400 displays the radio frequency power actually fed to the matching unit 104 obtained from the power detection signal 108 on the display unit 414. Since the displayed radio frequency power is based on the power measured directly by the power detection unit 106, it is automatically updated whenever the offset level for calibration is renewed and therefore the output power is adjusted. If the offset level is fixed, the final adjusted power is displayed.

At this time, since the power displayed on the display unit 414 (i.e., the radio frequency power fed to the matching unit 104), is equal to the set power level, the operator does not have to adjust the displayed radio frequency power to the set power level whenever the output power is adjusted as in the conventional case. In accordance with the embodiment, adjustment of the display unit required in the conventional case is unnecessary so that the calibration time of the radio frequency generator 200 can be further reduced.

In accordance with the embodiment, an operator does not involve in the calibration of the radio frequency generator 200 to thereby improve accuracy of the calibration result. By this, plasma can be stably generated in the chamber 300 of the plasma processing apparatus 100 and a variation of plasma generated in several plasma processing apparatuses can be prevented. Therefore, uniform plasma processing can be performed on a wafer in any chamber.

The power supply control signal 420 transmitted from the generator control unit 400 to the radio frequency generator 200 is digital data and the power detection signal 108 transmitted from the power detection unit 106 to the generator control unit 400 is also digital data. Because of this, noise effect is minimized and therefore the radio frequency generator 200 can be calibrated with high accuracy. Conventionally, accurate calibration was not possible if the set power level (set voltage) is small. In contrast, in accordance with the embodiment, radio frequency power adjusted to the set power level regardless of the size of the set power level can be supplied to the matching unit 104.

Since the power supply control signal 420 and the power detection signal 108 are digital data, various communication standards may be used for transmission. For example, in case of the DeviceNet (Registered trademark) standard, general usability and extensibility of electrical connection of the radio frequency generator 200, generator control unit 400 and power detection unit 106 are improved.

Since the conventional calibration of the radio frequency generator 200 required careful manual adjustment of the set voltage level, it was performed by connecting a dummy load to the radio frequency generator 200 for the secure adjustment. On the contrary, in the present embodiment, manual adjustment may not be needed and accurate calibration results can be obtained although the radio frequency generator 200 is connected to the matching circuit 104 and chamber 300. Further, labor for dummy load preparation before the calibration and setup time of the dummy load may be saved.

In the present embodiment, the power detection unit 106 is installed at the end portion of the coaxial cable 102. Power corresponding to the set power level is supplied to the matching unit 104 regardless of the size of the power consumed by the coaxial cable 102.

Further, the data processing unit 410 of the generator control unit 400 uses a ratio of a half of the difference to the set power level to calculate the offset level 424b. According to this calculation, each time the offset level 424b is calculated, the difference between the radio frequency power fed to the matching unit 104 and the set power level (set power level for calibration) is reduced in half. In this way, radio frequency power exactly corresponding to the set power level can be fed to the matching unit 104. On the other hand, a ratio of the difference to the set power level may be used to obtain the offset level 424b. In this case, since the first offset level 424b may be a fixed offset level, the calibration of the radio frequency generator 200 is completed in a shorter time.

(Configuration of Plasma Processing Apparatus in Second Embodiment)

Figure 5:
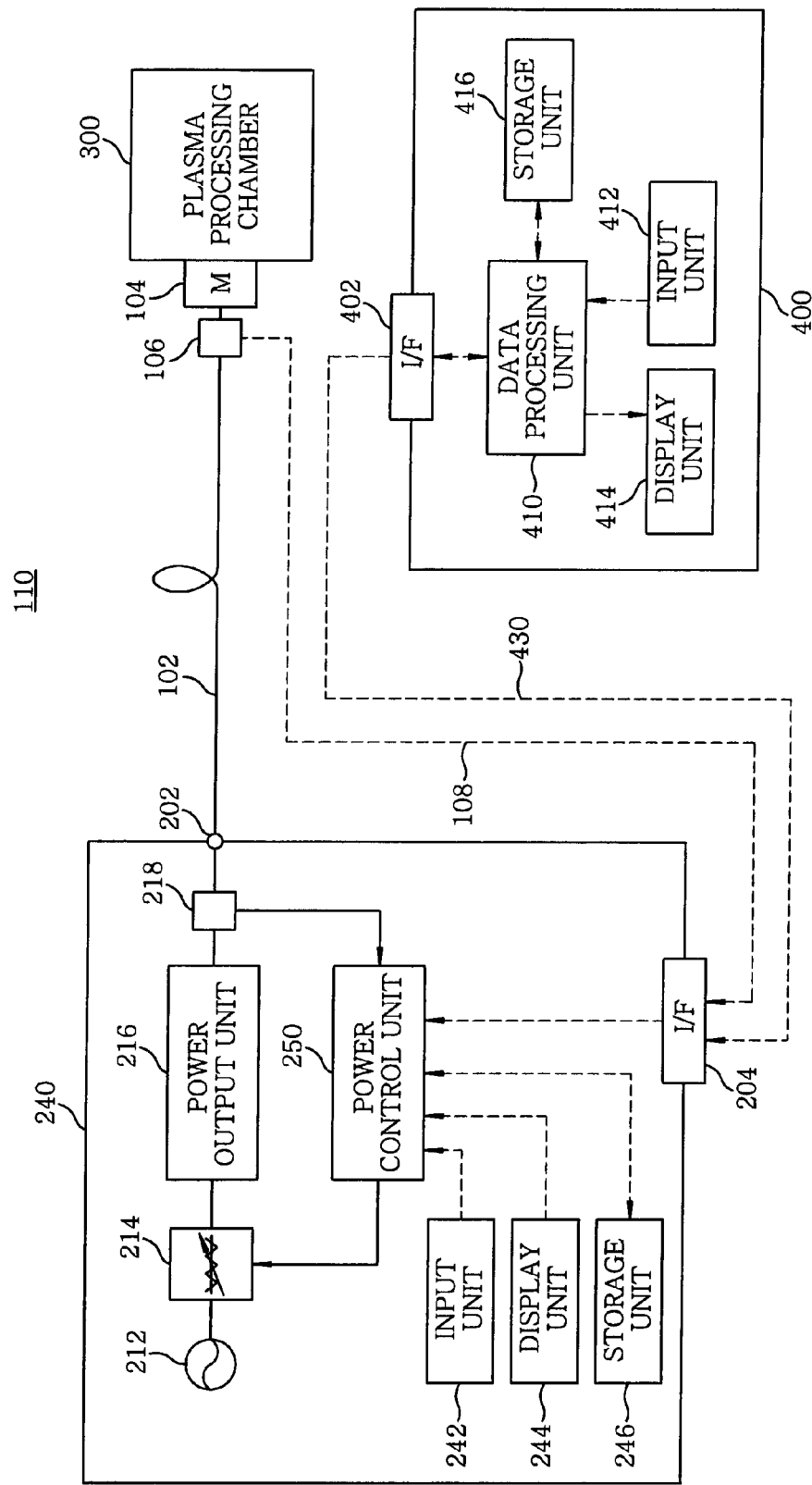
FIG. 5 is a block diagram showing a configuration of a plasma processing apparatus of the second embodiment of the present invention.

In the plasma processing apparatus 100 of the first embodiment, the radio frequency generator 200 receives the power supply control signal 420 from the generator control unit 400 and adjusts the target output power level based on the set power level 424a and the offset level 424b contained in the power supply control signal 420. On the contrary, a plasma processing apparatus 110 of the second embodiment is configured in such a way that a radio frequency generator 240 receives a power detection signal 108 directly from a power detection unit 106 and a power supply control signal 430 from a generator control unit 400. FIG. 5 is a block diagram showing a configuration of the plasma processing apparatus 110 of the second embodiment of the present invention.

As shown in FIG. 5, the plasma processing apparatus 110 includes the radio frequency generator 240, a coaxial cable 102 whose one end is coupled to a power output terminal 202 of the radio frequency generator 240, a matching unit 104 connected to the other end of the coaxial cable 102 and a chamber 300 connected to the matching unit 104. The plasma processing apparatus 110 also includes the power detection unit 106 which is interposed between the other end portion of the coaxial cable 102 and the matching unit 104 and the generator control unit 400 which is connected to the power detection unit 106 and to the radio frequency generator 240.

The radio frequency generator 240 includes an oscillator 212, an attenuator 214 for adjusting the level of a radio frequency signal from the oscillator 212 and a power output unit 216 for amplifying the radio frequency signal whose level is adjusted by the attenuator 214 and transmitting the amplified signal, i.e., radio frequency power, to the power output terminal 202. Further, the radio frequency generator 240 includes a power sensor 218 for measuring a target value of the radio frequency power outputted from the power output terminal 202 and a power control unit 250 connected to the power sensor 218 and to the attenuator 214.

It is also provided with an input unit 242 through which an operator enters or edits various data such as power supply setting parameters, a display unit 244 which is configured by a liquid crystal display showing an operating display, a selected display or the like, and a storage unit 246 for storing data which is inputted to the input unit 242 and then processed by the power control unit 250, data calculated by the power control unit 250 and the like.

The power control unit 250 is configured by, e.g., a DSP. By the power control unit 250 configured by a DSP, radio frequency power outputted from the power output terminal 202 can be controlled with high accuracy.

The radio frequency generator 240 includes an I/F unit 204 for digital communication with external devices. The I/F unit 204 in the present embodiment receives the power detection signal 108 from the power detection unit 106 and the power supply control signal 430 from the power control unit 400.

The power supply control signal 430 is, for example, serially transmitted. To be specific, the power supply control signal 430 is configured by only the set power level data 420a of the power supply control signal 420 shown in FIG. 2. In order to calibrate the radio frequency generator 240 shown in FIG. 5, the power supply control signal 430 containing only the set power level data 420a of FIG. 2 is transmitted from the generator control unit 400 unlike FIG. 1. This is because the radio frequency generator 240 receives the power detection signal 108 directly from the power detection unit 106 and then calculates the offset level 424b. Further, as for the data structure of the set power level data 420a of the power supply control signal 430, a parity bit is added next to the set power level data, a start bit is added at the beginning and a stop bit 428 is added at the end, which is the same as the set power level data 420a of FIG. 2.

Further, the power control unit 250 of the radio frequency generator 240 obtains a cable terminal power level Pe of the coaxial cable 102 based on the power detection signal 108 from the power detection unit 106 and then calculates the difference between the cable terminal power level Pe and the set power level contained in the power supply control signal 430. The power control unit 250 also calculates an offset level 424b by applying the difference to a specified equation, e.g., the equation 1. In the present embodiment, the offset level 424b is obtained by adding 1 to a ratio of a half of the difference to the set power level.

(Correction of Radio Frequency Generator of Second Embodiment)

Hereinafter, specific examples of the calibration method of the radio frequency generator 240 in the plasma processing apparatus 110 configured as described above will be described. With reference to the plasma processing apparatus 110 as shown in FIG. 5, if the radio frequency generator 240 is connected to the matching unit 104 via the coaxial cable 102, the operator enters commands to the input unit 412 so that the generator control unit 400 starts the calibration of the radio frequency generator 240. If the generator control unit 400 receives the commands, the data processing unit 410 forms a power supply control signal 430 containing the set power level 424a for calibration. Herein, the set power level 424a for calibration is 1700 W the same as that in the first embodiment.

The power supply control signal 430 created in this way is sent from the I/F unit 402 of the generator control unit 400 to the I/F unit 204 of the radio frequency generator 240 via a serial transmission line. The I/F unit 204 transmits the power supply control signal 430 to the power control unit 250. When receiving the power supply control signal 430, the I/F unit 204 or the power control unit 250 checks a data error based on the parity bit, and it may request the generator control unit 400 to retransmit the power supply control signal 430 if there is an error.

If receiving the power supply control signal 430 from the I/F unit 204, the power control unit 250 reads the set power level i.e., the set power level 424a for calibration, contained in the power supply control signal 430. In the present embodiment, the first received power supply control signal 430 has a set power level of 1700 W as the set power level, i.e., the set power level 424a for calibration. Further, the power control unit 250 applies an initial offset level 424b of 1 to the set power level, i.e., the set power level 424a for calibration contained in the first received power supply control signal 430. Therefore, the power control unit 250 controls the level adjustment operation of the attenuator 214 so that 1700 W obtained by multiplying the offset level 424b to the set power level 424a can be a target output power level.

After the radio frequency signal whose level is adjusted by the attenuator 214 is amplified by the power output unit 216 and then its frequency is adjusted, the signal is transmitted through the power output terminal 202. The output power level of the signal is always measured by the power sensor 218 and then feedback-controlled by the power control unit 250. The level adjustment operation of the attenuator 214 is controlled based on this, and therefore, the output power level can be stabilized at a target output power level of 1700 W.

In this way, radio frequency power of 1700 W from the radio frequency generator 240 is fed to the matching unit 104 via the coaxial cable 102. At that time, due to a power loss in the coaxial cable 102, the cable terminal power level of the coaxial cable 102, i.e., the radio frequency power actually fed to the matching unit 104, is smaller than 1700 W transmitted from the radio frequency generator 240, e.g., 1600 W. In this case, the power loss in the coaxial cable 102 is generally 100 W.

The power detection unit 106 measures the cable terminal power level, herein, 1600 W, and transmits the power detection signal 108 having the measurement result to the radio frequency generator 240. The power detection signal 108 is received by the I/F unit 204 of the radio frequency generator 240. The I/F unit 204 then transmits the power detection signal 108 to the power control unit 250. When receiving the power detection signal 108, the I/F unit 204 or the power control unit 250 checks a data error based on the parity bit, and it may request the power detection unit 106 to retransmit the power detection signal 108 if there is an error.

The power control unit 250 obtains the cable terminal power level from the power detection signal 108 and then calculates the difference between the cable terminal power level and the set power level for calibration. Further, the power control unit 250 calculates the offset level 424b by applying the difference to a specified equation, e.g., the equation 1. In the present embodiment, the offset level 424b is calculated by adding 1 to a ratio of a half of the difference to the set power level for calibration.

To be more specific, since the cable terminal power level is 1600 W and the set power level for calibration is 1700 W in the present embodiment, the difference of 100 W is calculated by the power control unit 250. Then, the offset level 424b for calibration is renewed to 1.0294 by adding 1 to a ratio of a half of the difference of 100 W, i.e., 50 W, to the set power level for calibration, i.e., 1700 W and stored in the storage unit 246.

Next, the power control unit 250 renews the offset level 424b for calibration and controls the level adjustment operation of the attenuator 214 so that 1750 W obtained by multiplying the new offset level to the set power level 424a can be a target output power level.

Then, radio frequency power of 1750 W is generated from the radio frequency generator 240 and supplied to the matching unit 104 via the coaxial cable 102. Although there is a power loss in the cable terminal power level, the output power from the power output terminal 202 increases and therefore the difference between the cable terminal power level and the set power level for calibration is smaller than the initial difference.

The power detection unit 106 measures the cable terminal power level and transmits the power detection signal 108 having the measurement result to the radio frequency generator 240. Then, the power control unit 250 of the radio frequency generator 240 gradually adjusts the offset level for calibration so that the cable terminal power level reaches the set power level for calibration in the end.

The offset level 424b at that time is fixed as an offset level for calibrating the output power, stored in the storage unit 246 in the radio frequency generator 240 and, at the same time the fixed offset level 242b and the set power level are displayed on the display unit 244.

Further, since the radio frequency generator 240 of the second embodiment receives the power detection signal 108 directly from the power detection unit 106 as described above, it obtains radio frequency power fed to the matching unit 104 from the power detection signal 108. The radio frequency generator 240 displays the radio frequency power actually fed to the matching unit 104 on the display unit 244 based on the power detection signal 108.

Since the displayed radio frequency power is based on the power measured directly by the power detection unit 106, it is automatically updated whenever the offset level for calibration is renewed and the output power is adjusted. If the offset level is fixed, the final adjusted power is displayed. At that time, since the power displayed on the display unit 244, i.e., the radio frequency power fed to the matching unit 104, is equal to the set power level, the operator does not have to adjust the displayed radio frequency power to the set power level whenever the output power is adjusted unlike the conventional case. Further, adjustment of the display unit required in the conventional case is unnecessary so that the calibration time of the radio frequency generator 240 can be further reduced.

Further, if the transmission line of the power supply control signal 420 (signal line), i.e., the transmission line connecting the I/F unit 402 of the generator control unit 400 and the I/F unit 204 of the radio frequency generator 240, uses the transmission method that allows two-way communication, the generator control unit 400 may be controlled so that the radio frequency generator 240 can receive the final power detection signal 108 from the power detection unit 106 through the transmission line at the time when the offset level is confirmed. By using this signal, the generator control unit 400 may display the radio frequency power fed to the matching unit 104 after the completion of the calibration on the display unit 414.

The fixed offset level may be converted into serial data, transmitted to the generator control unit 400 and then displayed with the set power level on the display unit 414. In the present embodiment, the fixed offset level is, e.g., 1.0850. If the offset level is fixed, the calibration of the radio frequency generator 240 is completed.

Upon the completion of the calibration, for any set power level transmitted to the radio frequency generator 240 from the generator control unit 400, radio frequency power derived by multiplying the fixed offset level to the set power level is generated from the radio frequency generator 240 in the same manner as the first embodiment. As for the all set power levels within the range from 0 W to 3000 W as well as the set power level for calibration, i.e., 1700 W, radio frequency power adjusted to the set power level can be supplied to the matching unit 104, accordingly.

In accordance with the second embodiment, the calibration time of the radio frequency generator 240 is significantly reduced and calibration accuracy is also improved.

The radio frequency generator 240 receives the power detection signal 108 directly from the power detection unit 106. Therefore, the feedback loop from the power detection unit 106 to the radio frequency generator 240 is simplified so that time to fix the offset level can be reduced and a calculation error in processing data can be reduced.

In the second embodiment, the generator control unit 400 transmits the power supply control signal 430 to set the set power level 424a of the radio frequency generator 240. However, for example, the set power level 424a may be entered to the input unit 242 of the radio frequency generator 240. In this case, the radio frequency generator 240 can be calibrated without using the generator control unit 400.

Further, the radio frequency generator 240 does not have to be calibrated only when the generator control unit 400 is connected. That is, the radio frequency generator 240 can perform its calibration on its own without the generator control unit 400. In this case, the operator may enter the set power level 424a for calibration to the input unit 242 of the radio frequency generator 240 instead of the commends from the generator control unit 400 and manipulate the input unit 242 to start the calibration of the radio frequency generator 240.

Figure 6:
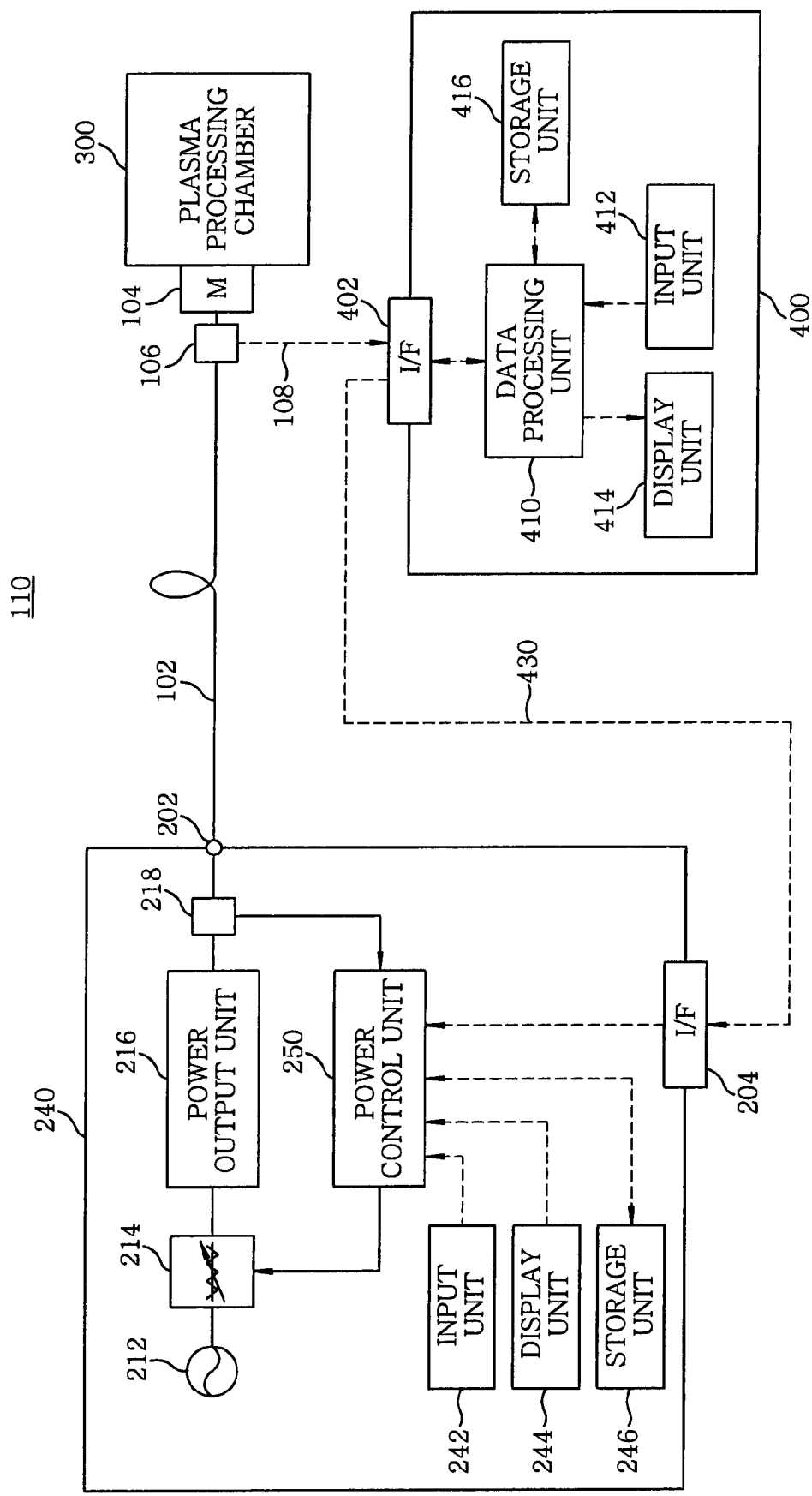
FIG. 6 is a block diagram showing a modified example of the plasma processing apparatus of the second embodiment of the present invention.

Although the second embodiment has been described with the radio frequency generator 240 which receives the power detection signal 108 directly from the power detection unit 106 through the I/F unit 204, it is not limited thereto. For example, as shown in FIG. 6, the power detection signal 108 from the power detection unit 106 may be transmitted to the I/F unit 402 of the generator control unit 400 and then it may be transmitted to the I/F unit 204 of the radio frequency generator 240 from the I/F unit 402 of the generator control unit 400 through the transmission line of the power supply control signal 430. By doing this, a transmission line to transmit the power detection signal 108 from the power detection unit 106 to the I/F unit 204 of the radio frequency generator 240 can be omitted.

(Configuration of Plasma Processing Chamber)

Figure 7:
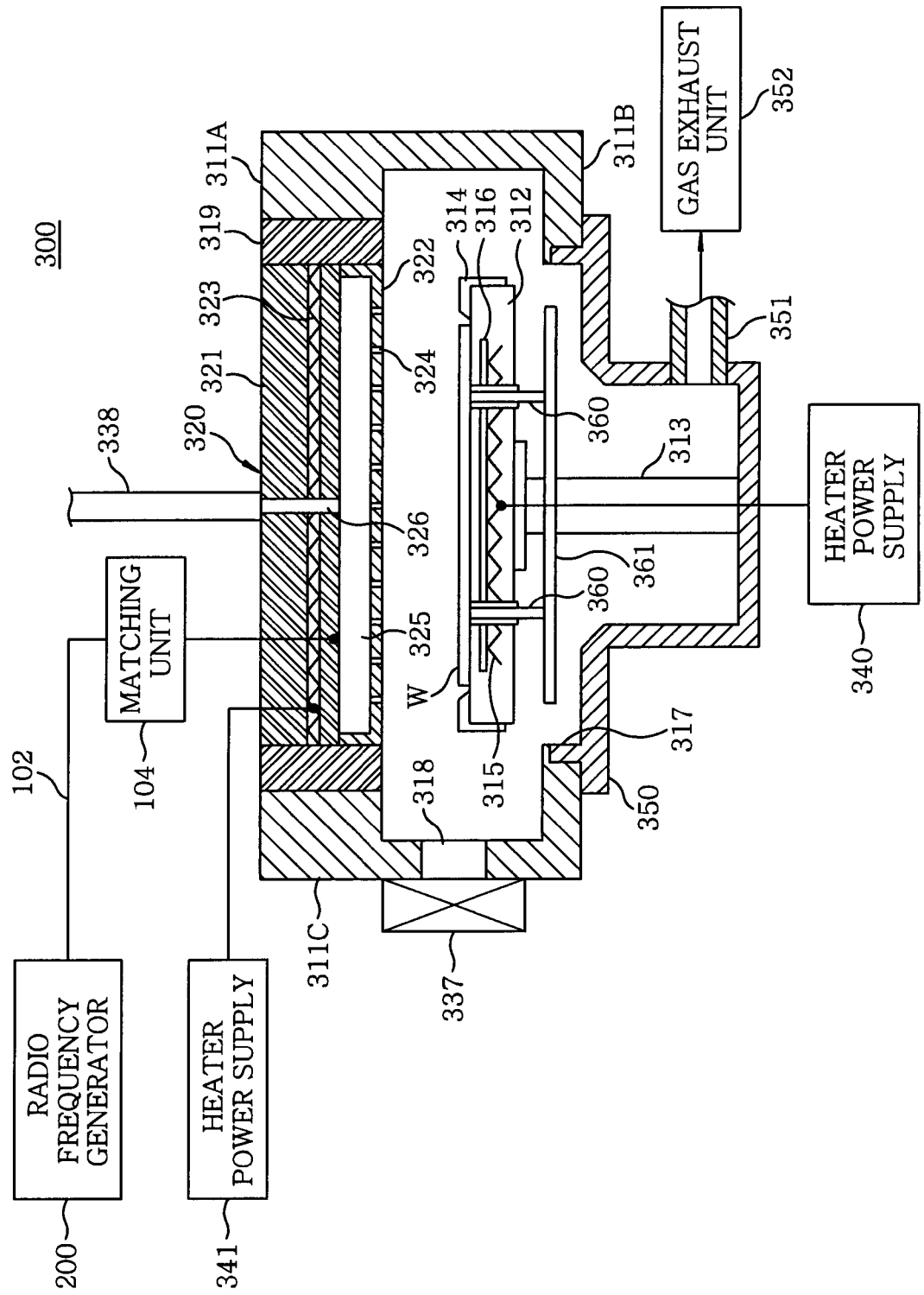
FIG. 7 is a configuration of a chamber for use in the plasma processing apparatus in FIGS. 1 or 5.
Figure 8:
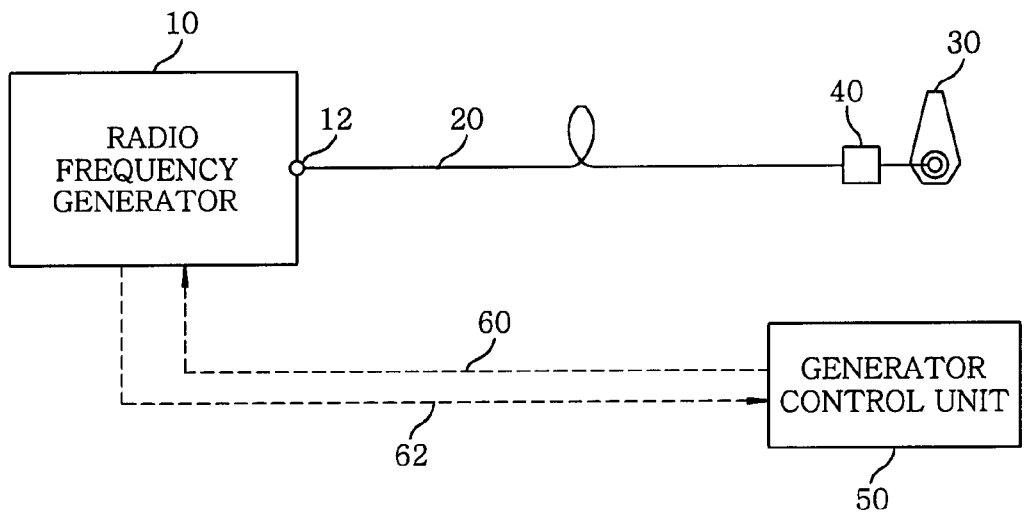
FIG. 8 shows a block diagram showing a configuration of a conventional power system for calibrating a radio frequency generator.
Figure 9:
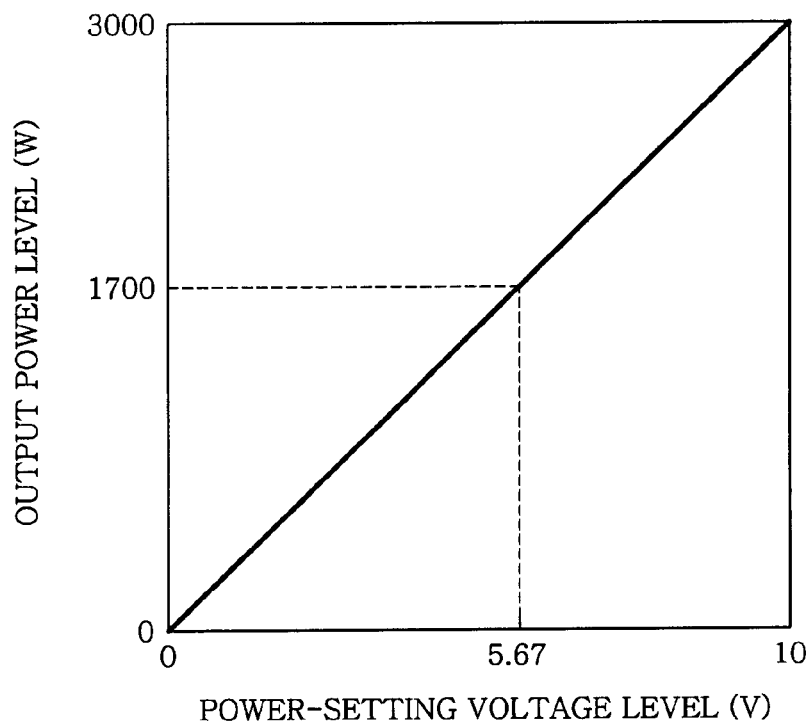
FIG. 9 is a graph showing a relationship between the power-setting voltage level and the output power level from a radio frequency generator.

Hereinafter, the configuration of the chamber 300 for use in the plasma processing apparatus 100 of the first embodiment or the plasma processing apparatus 110 of the second embodiment will be described with reference to the drawing. Herein, the chamber 300 is applied to a plasma processing apparatus for performing a film forming process on a wafer W by a plasma CVD method. FIG. 7 is a longitudinal cross-sectional view of the chamber 300. As shown in FIG. 7, the chamber 300 is formed in an approximately cylindrical shape and sealed airtight.

In the chamber 300, a susceptor 312 for horizontally mounting thereon the wafer W is supported by a supporting member 313 installed at a lower center portion of the susceptor 312. The susceptor 312 is made of ceramic such as AlN and a guide ring 314 for guiding the wafer W is provided on an outer peripheral portion of the susceptor 312.

Further, a heater 315 is embedded in the susceptor 312 to heat the wafer W to a specified temperature by power supplied from a heater power supply 340. A lower electrode 316 is embedded above the heater 315 in the susceptor 312 and the lower electrode 316 is grounded.

A shower head 320 serving as an upper electrode is attached to a ceiling wall 311A through an insulating member 319. The shower head 320 is roughly divided into an upper base member 321 and a lower shower plate 322.

A heater 323 is buried in the base member 321 to heat the shower head 320 to a specified temperature by power supplied from a heater power supply 341.

The shower plate 322 is provided with a plurality of injection openings 324 through which a gas is supplied into the chamber 300. Each injection opening 324 communicates with a gas diffusion space 325 formed between the base member 321 and the shower plate 322. A gas introduction port 326 is provided in the center of the base member 321 to supply a processing gas to the gas diffusion space 325. The gas introduction port 326 is connected to a gas supply line 338 for supplying a gas containing at least one of TiCl$_4$, Ar, H$_2$ and NH$_3$. In processing, the gas is supplied to the gas diffusion space 325 through the gas introduction port 326 of the shower head 320 and then introduced to the chamber 300 through the plurality of injection openings 324.

A circular opening 317 is formed at a center portion of a bottom wall 311B of the chamber 300 and the bottom wall 311B is provided with an exhaust chamber 350 protruding downward to cover the opening 317. Connected to a sidewall of the exhaust chamber 350 is an exhaust line 351, which is connected to a gas exhaust unit 352. By operating the gas exhaust unit 352, an inner pressure of the chamber 300 can be reduced to a specified vacuum level.

The susceptor 312 is provided with three wafer supporting pins 360 (two of them are only shown) for supporting the wafer W to lift up and down in such a manner that the wafer supporting pins 360 can be protruded from and sunk into the surface of the susceptor 312. The wafer supporting pins 360 are fixed to a supporting plate 361. Further, the wafer supporting pins 360 are moved up and down through the supporting plate 361 by a driving mechanism (not shown) such as an air cylinder or the like.

Provided at a sidewall 311C of the chamber 300 are a loading/unloading opening 318 for loading or unloading the wafer W and a gate valve 337 for opening and closing the load/unloading opening 318.

A matching unit 104 is connected to the shower head 320 of the chamber 300 configured as described above and a radio frequency generator 200 or 240 is connected to the matching circuit 104 via a coaxial cable 102.

When a film forming process is performed on the wafer W in the chamber 300, radio frequency power of 350 kHz is supplied to the shower head 320 from the radio frequency generator 200 calibrated by the above method. Therefore, a radio frequency electric field is generated between the shower head 320 and the lower electrode 316 to convert the processing gas supplied to the chamber 300 into plasma, thereby forming a Ti film or a TiN film on the wafer W.

The present invention is not limited to the plasma CVD apparatus described above, but may be applied to a plasma processing apparatus using plasma generated by radio frequency power supplied to an electrode in a chamber such as a dry etching apparatus, a sputtering apparatus, an ashing apparatus or the like. Further, the present invention may also be applied to various systems using a radio frequency generator, for example, a high-frequency laser generation system or a high-frequency heating system.

While the invention has been shown and described with respect to the embodiments, it will be understood by those skilled in the art that various changes and modifications may be made without departing from the scope of the invention as defined in the following claims.

What is claimed is:

1. A plasma processing apparatus comprising:
   a processing chamber that accommodates a substrate to be processed therein and capable of being exhausted to a vacuum level;
   a gas supply unit that supplies a process gas into the processing chamber to perform a plasma process;
   an exhaust unit that exhausts the process gas used to perform the plasma process;
   a radio frequency generator, which includes a data input terminal to which a set power level of radio frequency power and an offset level for calibrating output power are inputted as digital data and a power output terminal that outputs the radio frequency power, capable of adjusting a target output power level based on the set power level and the offset level to output radio frequency power corresponding to the target output power level via the power output terminal;
   a matching unit, connected to the radio frequency generator via a transmission line, that matches an impedance of a radio frequency generator side with an impedance of a chamber side;
   an electrode, provided in the processing chamber, to which radio frequency power from the matching unit is applied;
   a power detection unit, interposed between the transmission line and the matching unit, that measures a radio frequency power level fed to the matching unit; and
   a generator control unit that, when calibrating the radio frequency generator, controls the radio frequency power from the power output terminal of the radio frequency generator such that the radio frequency power level fed to the matching unit reaches the set power level by calculating the offset level based on the difference between the set power level and the power level measured by the power detection unit and transmitting the set power level and the offset level in digital form to the data input terminal of the radio frequency generator.

2. The plasma processing apparatus of claim 1, wherein the transmission line is formed of a coaxial cable.

3. The plasma processing apparatus of claim 1, wherein the digital data is serial data.

4. The plasma processing apparatus of claim 1, wherein the radio frequency generator calculates the target output power level by multiplying the set power level with the offset level.

5. The plasma processing apparatus of claim 1, wherein the radio frequency generator includes a radio frequency power stabilizing circuit that stabilizes the radio frequency power from the power output terminal to be maintained at the target output power level.

6. A plasma processing apparatus comprising:
   a processing chamber that accommodates a substrate to be processed therein and capable of being exhausted to a vacuum level;
   a gas supply unit that supplies a process gas into the processing chamber to perform a plasma process;
   an exhaust unit that exhausts the process gas used to perform the plasma process;
   a radio frequency generator, which includes a power output terminal that outputs radio frequency power, capable of adjusting a target output power level based on a set power level of radio frequency power and an offset level for calibrating output power to output radio frequency power corresponding to the target output power level via the power output terminal;
   a matching unit, connected to the radio frequency power via a transmission line, that matches an impedance of a radio frequency generator side with an impedance of a chamber side;
   an electrode, provided in the processing chamber, to which radio frequency power from the matching unit is applied; and
   a power detection unit, interposed between the transmission line and the matching unit, that measures a radio frequency power level fed to the matching unit,
   wherein the radio frequency generator retains an automatic calibration function of adjusting the radio frequency power from the power output terminal of the radio frequency generator such that the radio frequency power level fed to the matching unit reaches the set power level by receiving a power level measured by the power detection unit, calculating the offset level based on the difference between the measured power level and the set power level, and adjusting the target output power level based on the offset level and the set power level.

7. A method for calibrating a radio frequency generator to which a load is connected via a transmission line by using a generator control unit, the radio frequency generator including a data input terminal to which a set power level of radio frequency power and an offset level for calibrating output power are inputted as digital data and a power output terminal that outputs the radio frequency power, a target output power level is adjusted based on the set power level and the offset level, and radio frequency power corresponding to the target output power level is outputted via the power output terminal, the method comprising:

adjusting the target output power level by inputting a set power level for calibration and an offset level for calibration to the data input terminal of the radio frequency generator by the generator control unit and outputting radio frequency power corresponding to the target output power level via the power output terminal;

renewing the offset level for calibration based on the difference between radio frequency power level applied to the load, which has been measured by a power detection unit interposed between the transmission line and the load, and the set power level by the generator control unit to transmit the renewed offset level for calibration to the data input terminal of the radio frequency generator;

repeating the step of adjusting the target output power level and the step of renewing the offset level for calibration to transmit it until the measured power level reaches the set power level; and setting the offset level for calibration when the measured power level reaches the set power level as an offset level for calibrating the output power of the radio frequency generator.

8. A method for calibrating a radio frequency generator to which a load is connected via a transmission line, the radio frequency generator including a power output terminal that outputs radio frequency power, and is configured such that a target output power level is adjusted based on a set power level of radio frequency power and an offset level for calibrating output power and radio frequency power corresponding to the target output power level is outputted via the power output terminal, the method comprising:

adjusting the target output power level based on a set power level for calibration and an offset level for calibration by the generator control unit to output radio frequency power corresponding to the target output power level via the power output terminal of the radio frequency generator;

renewing the offset level for calibration based on the difference between radio frequency power level applied to the load, which has been measured by a power detection unit interposed between the transmission line and the load, and the set power level by the radio frequency generator;

repeating the step of adjusting the target output power level and the step of renewing the offset level for calibration until the measured power level reaches the set power level; and setting the offset level for calibration when the measured power level reaches the set power level as an offset level for calibrating the output power of the radio frequency generator.

9. The method of claim 7, wherein the offset level for calibration changes according to a half of the difference between the measured power level and the set power level.

10. The method of claim 8, wherein the offset level for calibration changes according to a half of the difference between the measured power level and the set power level.

11. The method of claim 7, wherein the load includes a chamber in which a plasma process is performed on a substrate to be processed by plasma generated by radio frequency power supplied from the radio frequency generator via the transmission line and a matching unit, installed between the transmission line and the chamber, that matches the impedance between the chamber and the transmission line.

12. The method of claim 8, wherein the load includes a chamber in which a plasma process is performed on a substrate to be processed by plasma generated by radio frequency power supplied from the radio frequency generator via the transmission line and a matching unit, installed between the transmission line and the chamber, that matches the impedance between the chamber and the transmission line.

13. A radio frequency generator comprising:
an oscillator;
a level adjustment unit that adjusts an output level of the oscillator;
an amplifying unit that amplifies an output from the level adjustment unit;
a power output terminal that transmits radio frequency power from the amplifying unit;
a data input terminal to which a set power level of the radio frequency power and an offset level for calibrating the output power from the power output terminal are inputted as digital data; and
a power control unit that calculates a target output power level based on the set power level and offset level inputted to the data input terminal, and controls the level adjustment unit such that radio frequency power corresponding to the target output power level is outputted via the power output terminal.

14. A radio frequency generator comprising:
an oscillator;
a level adjustment unit that adjusts an output level of the oscillator;
an amplifying unit that amplifies an output from the level adjustment unit;
a power output terminal that transmits radio frequency power from the amplifying unit to a transmission line; and
a power control unit that receives power measured by a power detection unit connected to an end portion of the transmission line, calculates an offset level by using the difference between the measured power level and a set power level of radio frequency power, computes a target output power level based on the offset level and the set power level, and controls the level adjustment unit such that radio frequency power corresponding to the target output power level is outputted via the power output terminal.

* * * * *